United States Patent
Mallikarjunaswamy et al.

(10) Patent No.: US 6,888,710 B2
(45) Date of Patent: May 3, 2005

(54) INSULATED GATE BIPOLAR TRANSISTOR AND ELECTROSTATIC DISCHARGE CELL PROTECTION UTILIZING INSULATED GATE BIPOLAR TRANSISTORS

(75) Inventors: Shekar Mallikarjunaswamy, San Jose, CA (US); Sohel Imtiaz, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/336,129

(22) Filed: Jan. 3, 2003

(65) Prior Publication Data

US 2004/0137690 A1 Jul. 15, 2004

(51) Int. Cl.$^7$ ................................................ H02H 9/00
(52) U.S. Cl. ............................ 361/56; 361/58; 361/111
(58) Field of Search ............................ 361/56, 58, 111, 361/113, 118, 119, 91.1, 100

(56) References Cited

U.S. PATENT DOCUMENTS

| 4,109,274 A | 8/1978 | Belenkov et al. ............. 357/38 |
| 4,605,980 A | 8/1986 | Hartranft et al. ............. 361/56 |
| 4,745,450 A | 5/1988 | Hartranft et al. ........ 357/23.13 |

(Continued)

FOREIGN PATENT DOCUMENTS

WO   WO 96/30936   10/1996

OTHER PUBLICATIONS

Antinone, Robert J. et al., "Electrical Overstress Protection For Electronic Devices," Noyes Publications, pp. 17–26.
Pendharkar, Sameer et al., "SCR–LDMOS—A Novel LDMOS Device With ESD Robustness," 2000 IEEE, pp. 341–344.
Wang, Albert Z.H. et al., "An On–Chip ESD Protection Circuit with Low Trigger Voltage in BiCMOS Technology," IEEE Journal of Solid–State Circuits, vol. 36, No. 1, Jan. 2001, pp. 40–45.
Antinone, Robert J. et al., "Electrical Overstress Protection For Electronic Devices," Park Ridge, N.J., U.S.A.: Noyes Publications, 1986, pp. 17–26.
Iwamuro, N. et al., "Switching Loss Analysis Of Shorted Drain Non Punch–Through And Punch–Through Type IGBTS In Voltage Resonant Circuit," 3$^{rd}$ International Symposium on Power Semiconductor Devices and ICS, ISPSD '91, Apr. 22–24, 1991, pp. 220–225.
Simpson, M. R. et al., "Analysis Of The Lateral Insulated Gate Transistor," International Electron Devices meeting, Washington, D.C., Dec. 1–4, 1985, pp. 740–743.
Shekar Mallikarjunaswamy: U.S. Appl. No. 10/336,202, filed Jan. 3, 2003 entitled "Thick Gate Oxide Transistor And Electrostatic Discharge Protection Utilizing Thick Gate Oxide Transistors", 28 pgs.
Charvaka Duvvury et al. "Substrate Pump NMOS for ESD Protection Applications," Silicon Technology Development, Texas Instruments, Dallas, Texas, 11 pages.

*Primary Examiner*—Stephen W. Jackson
(74) *Attorney, Agent, or Firm*—Bever, Hoffman & Harms

(57) ABSTRACT

An electrostatic discharge (ESD) protection circuit which includes an Insulated Gate Bipolar Transistor (IGBT), a collector clamp, and a resistor. The IGBT collector is coupled with a circuit pad, and the emitter is coupled to ground. The collector clamp is coupled with the pad and the IGBT gate, and the resistor is coupled with the IGBT emitter and gate. When the voltage at the pad is below the trigger voltage of collector clamp, the collector clamp remains in a blocking state, thus preventing the IGBT from conducting. At the onset of an ESD event, when a voltage greater than the trigger voltage of the collector clamp appears at the pad, the collector clamp conducts, causing current flow through the resistor, thus turning on the IGBT and latching a parasitic thyristor formed in the IGBT until the ESD charge is dissipated.

16 Claims, 6 Drawing Sheets

U.S. PATENT DOCUMENTS

| | | | |
|---|---|---|---|
| 4,748,533 A | * | 5/1988 | Hertrich et al. ............... 361/56 |
| 4,807,080 A | | 2/1989 | Clark ......................... 361/56 |
| 5,162,888 A | | 11/1992 | Co et al. .................... 257/408 |
| 5,374,844 A | | 12/1994 | Moyer |
| 5,424,226 A | | 6/1995 | Vo et al. ....................... 437/30 |
| 5,504,444 A | | 4/1996 | Neugebauer ............... 327/108 |
| 5,528,188 A | | 6/1996 | Au et al. |
| 5,536,958 A | * | 7/1996 | Shen et al. ................. 257/356 |
| 5,537,075 A | | 7/1996 | Miyazaki .................... 327/566 |
| 5,546,038 A | | 8/1996 | Croft |
| 5,571,737 A | | 11/1996 | Sheu et al. ................... 437/44 |
| 5,578,860 A | | 11/1996 | Costa et al. ................ 257/528 |
| 5,602,404 A | | 2/1997 | Chen et al. ................. 257/112 |
| 5,631,793 A | | 5/1997 | Ker et al. |
| 5,753,920 A | | 5/1998 | Buehler et al. ........ 250/370.06 |
| 5,844,280 A | | 12/1998 | Kim ........................... 257/355 |
| 5,870,268 A | | 2/1999 | Lin et al. .................... 361/111 |
| 5,959,488 A | | 9/1999 | Lin et al. |
| 6,013,942 A | | 1/2000 | Soderbarg et al. |
| 6,064,109 A | | 5/2000 | Blanchard et al. |
| 6,064,249 A | | 5/2000 | Duvvury et al. ............ 327/314 |
| 6,097,235 A | | 8/2000 | Hsu et al. |
| 6,194,764 B1 | | 2/2001 | Gossner et al. |
| 6,225,649 B1 | | 5/2001 | Minato |
| 6,320,232 B1 | | 11/2001 | Gossner et al. |
| 6,414,532 B1 | | 7/2002 | Su et al. |
| 6,437,419 B1 | | 8/2002 | Bhalla et al. |
| 6,469,560 B1 | | 10/2002 | Chang et al. |
| 6,507,471 B2 | | 1/2003 | Colclaser et al. |

* cited by examiner

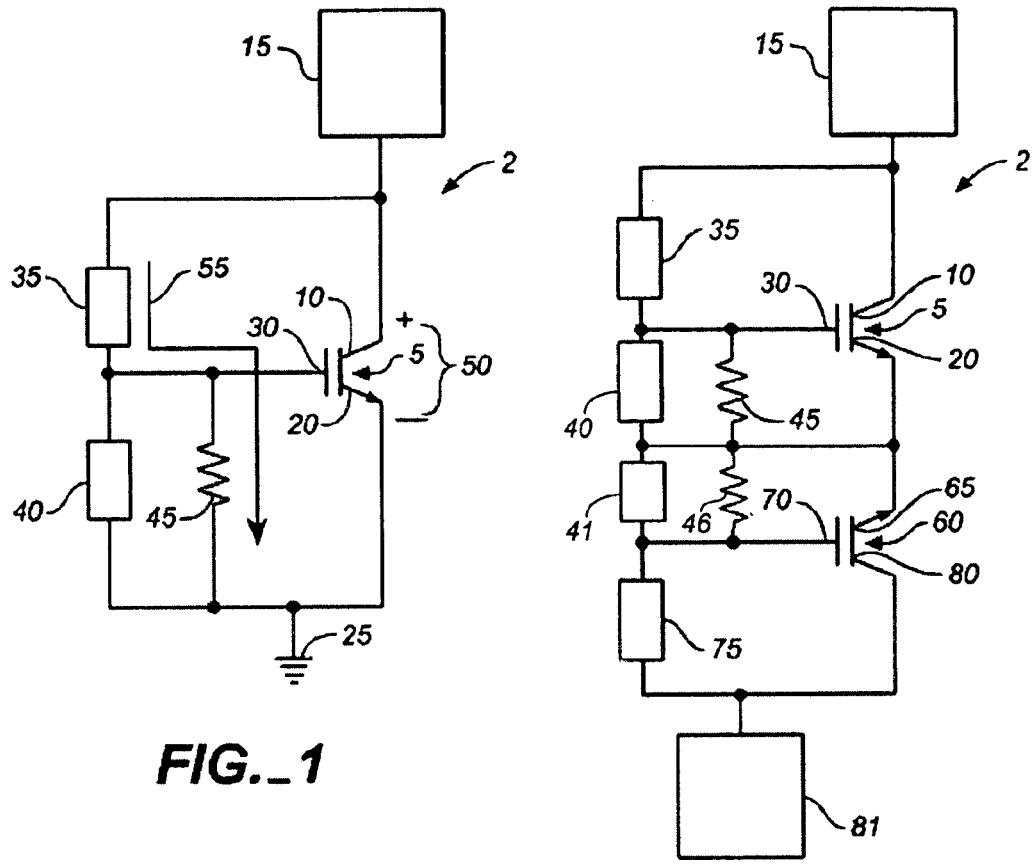
FIG._1
FIG._3
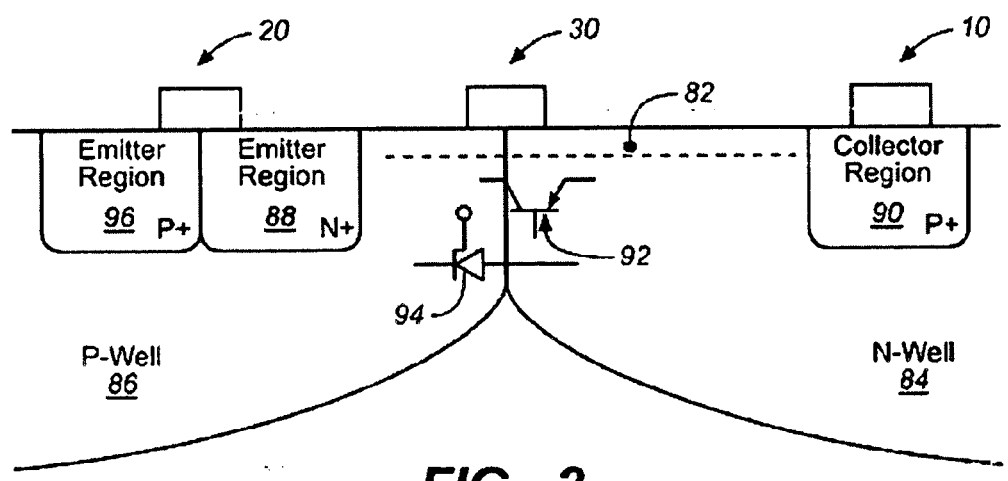
FIG._2

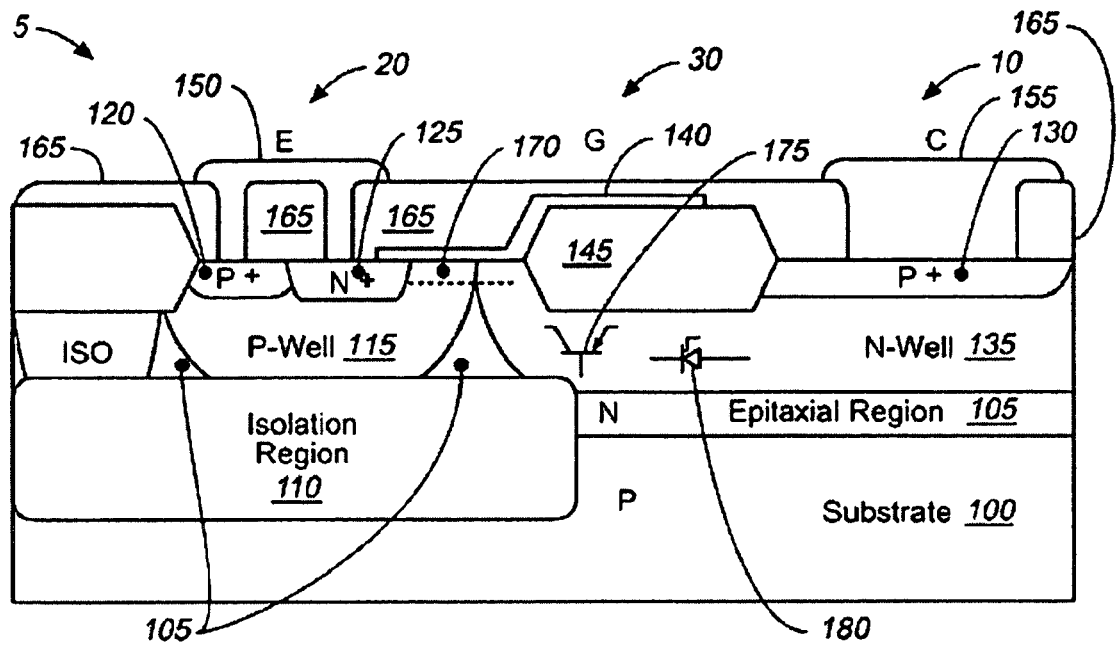
FIG._4
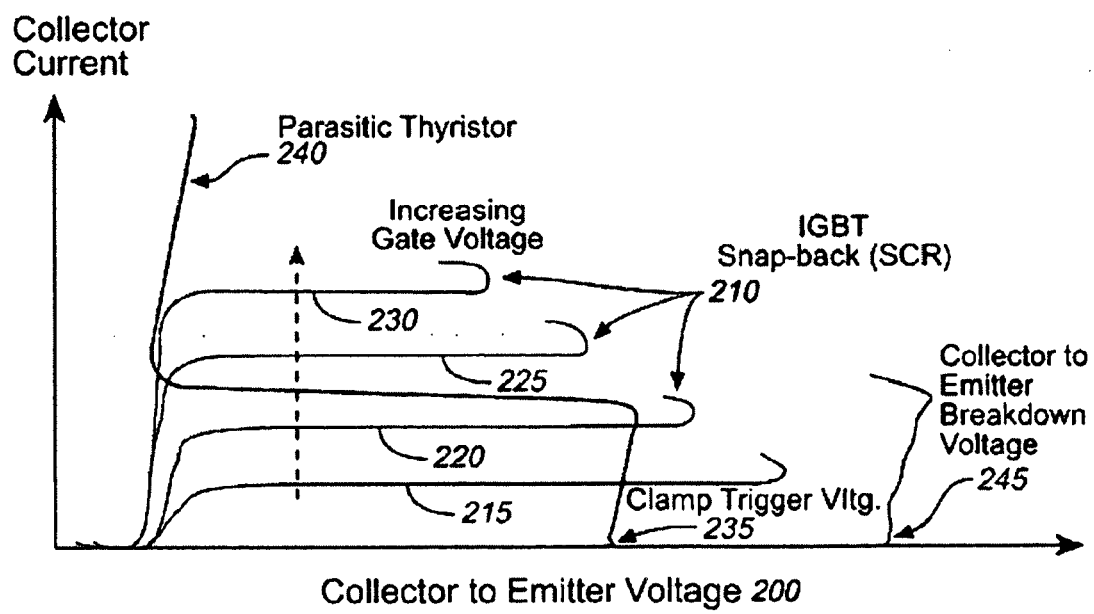
FIG._5

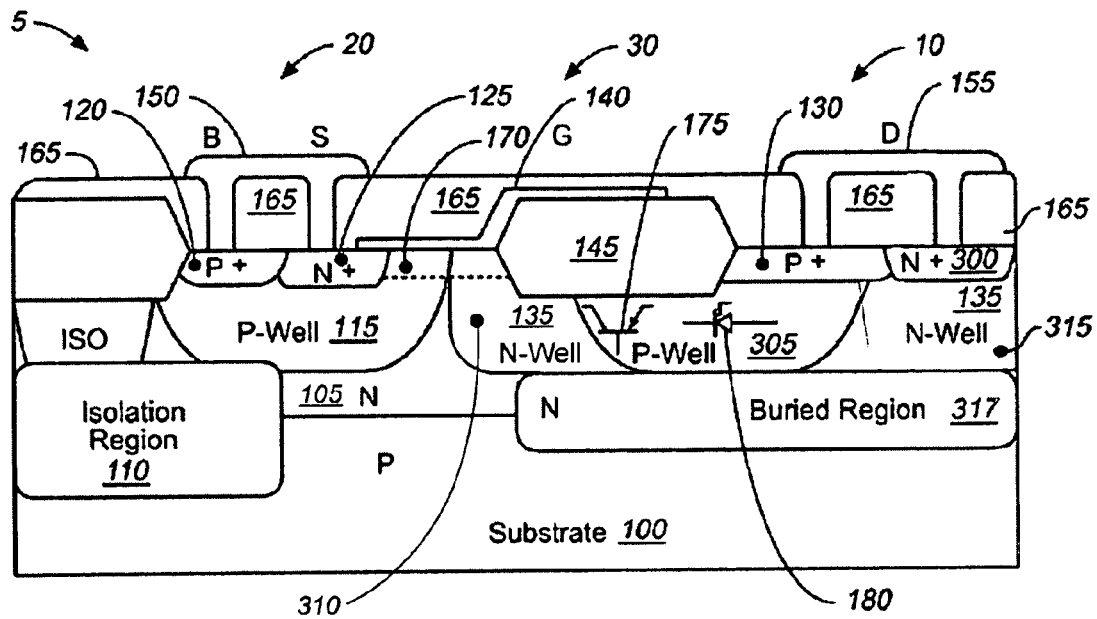
FIG._6
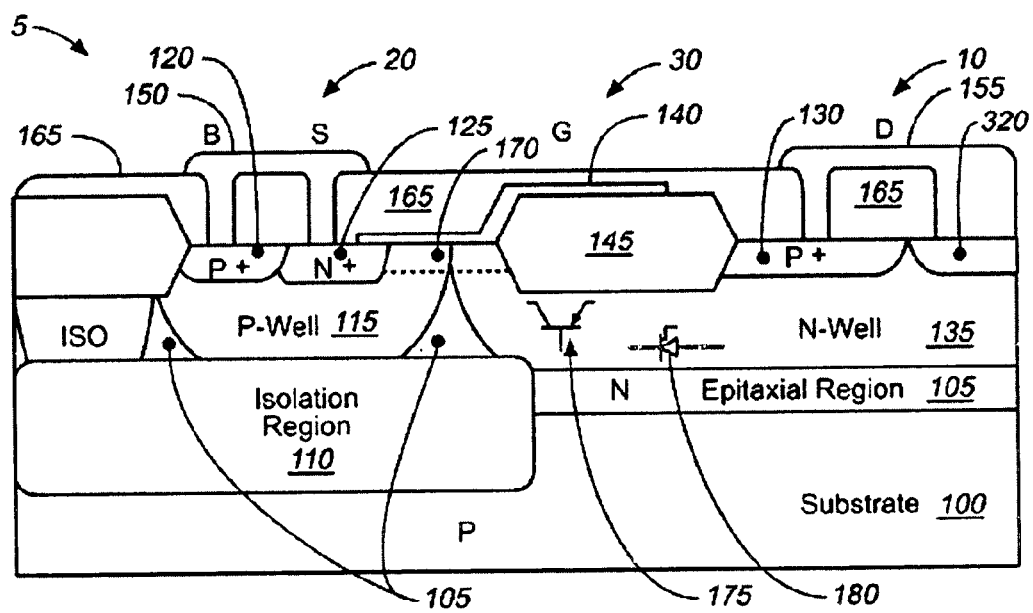
FIG._7

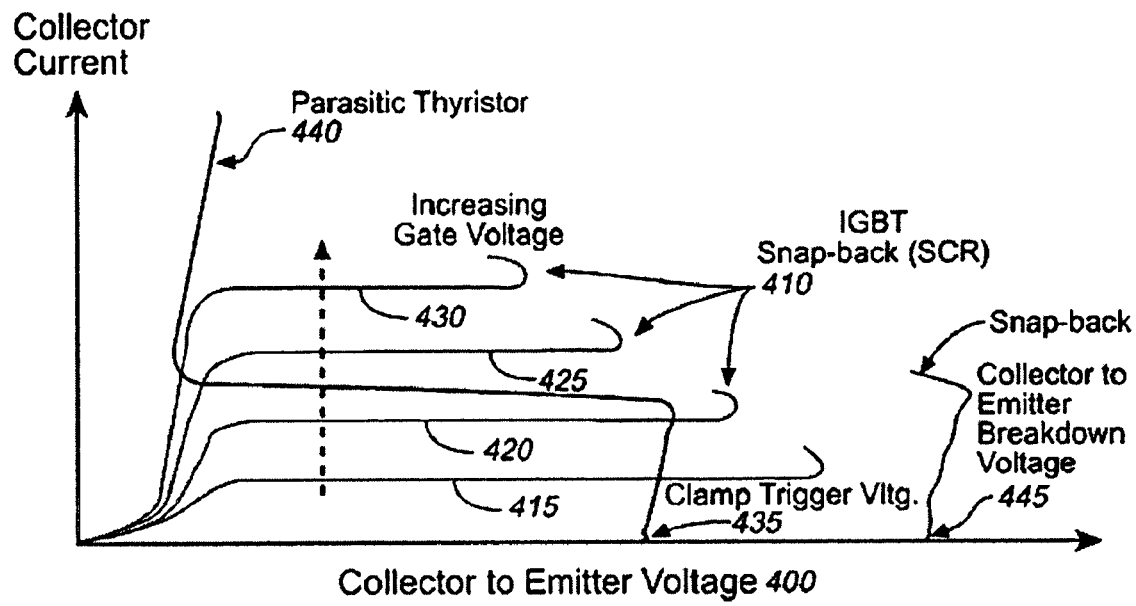
FIG._8
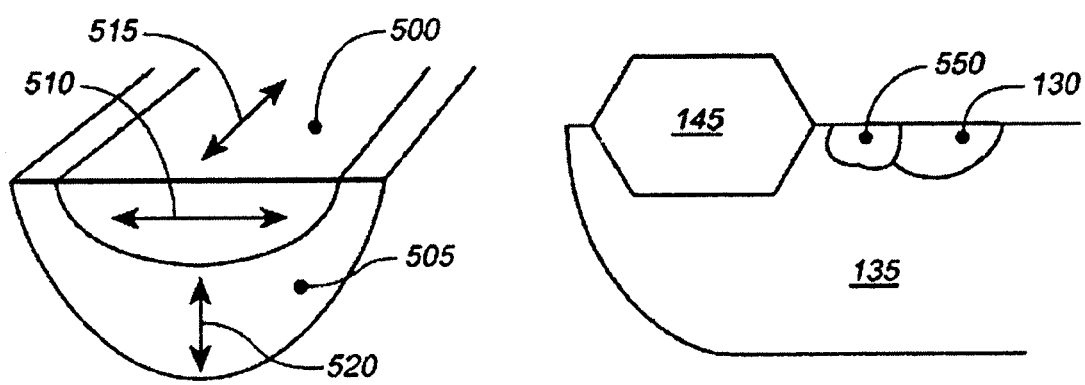
FIG._9  FIG._10

INSULATED GATE BIPOLAR TRANSISTOR AND ELECTROSTATIC DISCHARGE CELL PROTECTION UTILIZING INSULATED GATE BIPOLAR TRANSISTORS

BACKGROUND

1. Technical Field

The disclosure relates to electrostatic discharge protection of integrated circuits and, in particular, to insulated gate bipolar transistors for electrostatic discharge protection of integrated circuits.

2. The Related Art

A problem in designing integrated circuits is dealing with electrostatic discharge (ESD), which is caused by static electricity built up by the human body and machines that handle integrated circuits. The static electricity is discharged into the integrated circuit upon contact or close proximity with the integrated circuit. Static electricity follows any discharge path to alleviate the high electron build-up or deficiency. When an ESD sensitive device, such as an integrated circuit, becomes part of the discharge path, or is brought within the bounds of an electrostatic field, the sensitive integrated circuit can be permanently damaged.

ESD destruction of metal-oxide silicon field-effect transistor (MOSFET) devices occurs when the gate-to-source or gate-to-drain voltage is high enough to arc across the gate dielectric of a transistor device. The arc burns a microscopic hole in the gate oxide, which permanently destroys the MOSFET. Like any capacitor, the gate of a MOSFET must be supplied with a finite charge to reach a particular voltage. Larger MOSFETs have greater capacitance and are therefore less susceptible to ESD than are smaller MOSFETs. Typically, an immediate failure will not occur until the gate-to-source or gate-to-drain voltage exceeds the dielectric breakdown voltage by two to three times the rated maximum voltage of the gate oxide. The voltages required to induce ESD damage in some transistors can be as high as thousands of volts or as low as 50 volts, depending upon the oxide thickness.

Electrostatic fields can also destroy power MOSFETs by corona discharge. The failure mode is caused by ESD, but the effect is caused by placing the unprotected gate of the MOSFET in a corona discharge path. Corona discharge is caused by a positively or negatively charged surface discharging into small ionic molecules in the air.

When designing an integrated circuit, a voltage rating is selected for the pad connecting a node in the circuit. The rating is the maximum voltage that the integrated circuit or pad is designed to withstand without causing damage. ESD protection circuits are generally designed to protect integrated circuits or pads from voltages above the rating for the integrated circuit or housing.

Automotive applications, for example, demand robust protection (typically 8 kV to 25 kV human body model on a system level) against the threat of ESD or other transient pulses, such as load dump. General applications typically require protection at a minimum of 2,000 volts. Unfortunately, many power MOSFET device designs are unable to meet this requirement.

Therefore, there exists a need to effectively protect circuits from the effects of ESD both cost effectively and efficiently.

SUMMARY OF THE DISCLOSURE

In accordance with the present invention, an electrostatic discharge (ESD) protection circuit that includes an Insulated Gate Bipolar Transistor (IGBT) is disclosed. In some embodiments, the IGBT-based ESD circuit improves the ability to withstand ESD events. In additional embodiments pad designs that take advantage of the ESD circuits with IGBTs are disclosed.

In one embodiment, a circuit for protection from electrostatic discharge events comprises an insulated gate bipolar transistor comprising a gate, an emitter and a collector. The collector is coupled with a pad, and the emitter is coupled with a potential. A collector clamp is coupled with the pad, and the gate of the insulated gate bipolar transistor, and a resistance is coupled with the emitter and the gate of the insulated gate bipolar transistor.

In another embodiment, a structure for electrostatic discharge protection of pads housing integrated circuits comprises a pad, an insulated gate bipolar transistor fabricated on the pad, a collector clamp coupled with the pad and the insulated gate bipolar transistor, and a resistor coupled with the insulated gate bipolar transistor.

In a further embodiment, an insulated gate bipolar transistor comprises a substrate, a first well region and a second well region within the substrate, a collector region within the first well region, first and second emitter regions within the second well region, and a first electrode connected with the first well region and the collector region.

In an additional embodiment, an insulated gate bipolar transistor comprises a substrate, a first well region and a second well region within the substrate, first and second collector regions within the first well region, and first and second emitter regions within the second well region.

In yet another embodiment, an insulated gate bipolar transistor comprises a substrate, a first well region and a second well region within the substrate, a first collector region within the first well region, first and second emitter regions within the second well region, and a third well region within the first well region.

In yet a further embodiment, a method is provided for protecting integrated circuits from electrostatic discharge events. A circuit including an insulated gate bipolar transistor that is coupled to a pad that is bonded to integrated circuits is provided. The method comprises triggering the insulated gate bipolar transistor, at a clamp trigger voltage, in response to an electrostatic build up on the pad that is at least equal to the clamp trigger voltage, and latching a parasitic thyristor of the insulated gate bipolar transistor, at a latching voltage that is greater than the clamp trigger voltage.

BRIEF DESCRIPTION OF THE DRAWINGS

FIG. 1 is a schematic diagram of an embodiment of a circuit for electrostatic discharge protection;

FIG. 2 is a simplified diagram of an embodiment of a lateral insulated gate bipolar transistor for use in a circuit for electrostatic discharge protection;

FIG. 3 illustrates another embodiment of a circuit for electrostatic discharge protection;

FIG. 4 is a cross-sectional side view of an embodiment of a lateral insulated gate bipolar transistor;

FIG. 5 is a graph of the current-voltage characteristics of a collector of the lateral insulated gate bipolar transistor illustrated in FIG. 4;

FIG. 6 is a cross-sectional side view of an another embodiment of a lateral insulated gate bipolar transistor;

FIG. 7 is a cross-sectional side view of a further embodiment of a lateral insulated gate bipolar transistor;

FIG. 8 is a graph of the current-voltage characteristics of a collector of a lateral insulated gate bipolar transistor illustrated in FIGS. 6 and 7;

FIG. 9 illustrates a well region of an embodiment of a lateral insulated gate bipolar transistor;

FIG. 10 is a cross-sectional side view of an embodiment of a lateral insulated gate bipolar transistor with leakage current reduction;

In the present disclosure, like objects that appear in more than one figure are provided with like reference numerals. Further, objects in the figures and relationships in sizes between objects in the figures are not to scale.

DETAILED DESCRIPTION OF THE DRAWINGS

Figure 11:
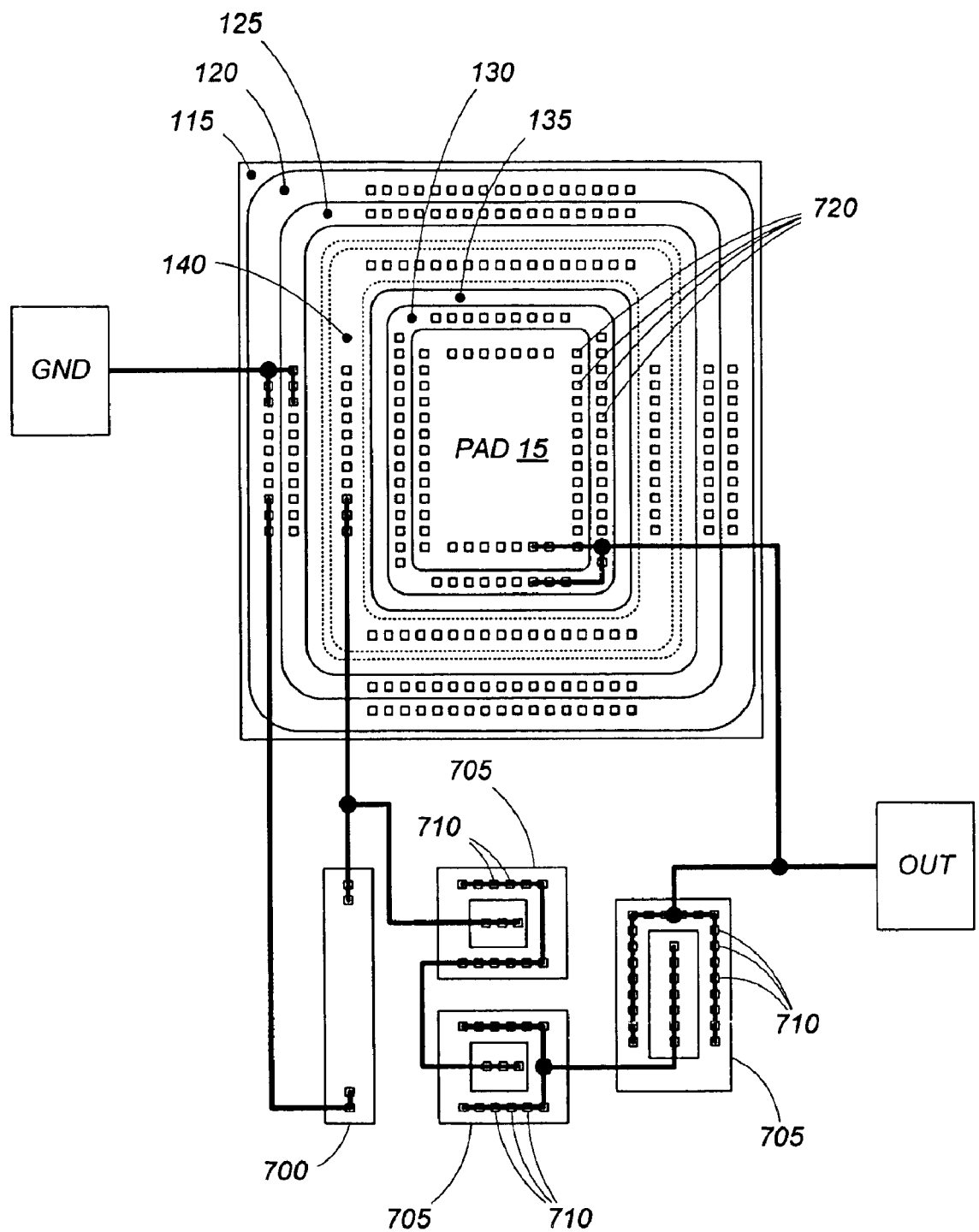
FIG. 11 is layout of an embodiment of a pad with an electrostatic discharge protection circuit fabricated upon it.

Referring to FIG. 1, a circuit 2 for electrostatic discharge protection is illustrated. A pad 15, along with any integrated circuits coupled to pad 15, are protected by electrostatic discharge (ESD) protection circuit 2. ESD protection circuit 2 includes an insulated gate bipolar transistor (IGBT) 5 that has a collector 10 coupled to pad 15. IGBT 5 also has an emitter 20 that is coupled to a potential 25 that can be, for example, a ground potential. The ground potential can be a ground bus or a ground pad, as is known in the art. Gate 30 of IGBT 5 is coupled through a collector clamp 35, which comprises one or more diodes, to pad 15. A resistor 45 is coupled between emitter 20 and gate 30. Further, an emitter clamp 40, which also comprises one or more diodes, may be coupled between emitter 20 and gate 30. Emitter clamp 40 is designed to protect gate 30 of IGBT 5 from current surges through collector clamp 35 that could burn through the gate dielectric of gate 30.

Collector 35 and emitter clamp 40 can, for example, be zener diodes, diodes, or active clamps, e.g., gate shorted MOSFETs.

When the voltage at pad 15 is below the trigger voltage of collector clamp 35, collector clamp 35 is in a blocking state. As long as collector clamp 35 is not triggered, i.e., does not conduct, emitter 20 and gate 30 are both at potential 25, thus preventing IGBT 5 from conducting. At the onset of an ESD event, when a voltage greater than the trigger voltage of collector clamp 35 appears at pad 15, collector clamp 35 will begin conduction. Conduction by collector clamp 35 causes a current to flow along path 55 through resistor 45.

Once a positive voltage with respect to emitter 20 appears at gate 30, due to the current flow through resistor 45, IGBT 5 will enter its forward conduction state, resulting in an increasing collector to emitter voltage 50. As the collector to emitter voltage 50 increases, it will reach a level at which the current through IGBT 5 latches a parasitic thyristor that exists in the structure of IGBT 5. Latching of the parasitic thyristor causes a substantial decrease in the collector to emitter voltage 50. The substantial decrease in collector to emitter voltage 50 results in dissipation of charge at the pad 15, almost instantaneously. The parasitic thyristor structure of IGBT 5 will continue to conduct until all of the charge at the pad 15 is dissipated.

In some embodiments, ESD protection circuit 2 is fabricated upon pad 15, an embodiment of which is depicted in FIG. 11.

Referring to FIG. 2, a simplified diagram of an embodiment of a lateral insulated gate bipolar transistor for use in a circuit 2 for electrostatic discharge protection is illustrated. In FIG. 2, n-well 84 forms a junction with p-well 86. A collector region 90, which is a p$^+$-type material, is formed in n-well 84. A first emitter region 88, which is a n$^+$-type material, and a second emitter region 96, which is a p$^+$-type material, are formed in p-well 86.

When a voltage is applied at gate 30 that exceeds the threshold voltage for IGBT 5, an inversion layer 82 forms on the surface of n-well 84. A voltage at gate 30 will arise when a current flows along path 55 (FIG. 1), thus pulling up the gate voltage due to the current flowing through resistor 45.

Formation of inversion layer 82 causes electrons to flow through inversion layer 82 from first emitter region 88 on the surface of p-well 86 to n-well 84. Holes flow in the reverse direction of the electrons, when collector 90 is forward biased with respect to n-well 84, e.g., when the collector 90 is at a potential of 0.7 volts greater than n-well 84. The flow of holes into n-well 84 turns on bipolar transistor 92, as n-well 84 forms the base of a pnp bipolar transistor 92. Bipolar transistor 92, which is formed from collector region 90 (transistor collector), n-well 84 (transistor base), and p-well 86 (transistor emitter), is inherent in the structure of IGBT 5.

When the holes collected by well 86 flow under first emitter region 88 into second emitter region 96, they forward bias the junction between first emitter region 88 and second emitter region 96, which causes a parasitic thyristor 94 to latch up. Parasitic thyristor 94 is formed from collector region 90, n-well 84, p-well 86, and first emitter region 88. At latch up, parasitic thyristor 94 will not respond to changes in the current or voltage at gate 30 of IGBT 5. Current will flow through parasitic thyristor 94 until all of the charge at pad 15 is dissipated.

Triggering a parasitic thyristor in the structure of an IGBT to dissipate ESD-induced voltages provides several advantages over MOSFET-based ESD protection schemes. One advantage is improved power dissipation by ESD protection circuit 2. The improved power dissipation increases the useful life of ESD protection circuit 2.

Referring again to FIG. 1, when collector clamp 35 consists of diodes, the trigger voltage would be the sum of the reverse breakdown voltages of the one or more diodes that comprise collector clamp 35. By changing the trigger voltage of collector clamp 35, the voltage at which IGBT 5 begins conduction is altered, allowing a system designer to change the rating of pad 15 without having to redesign or change out IGBT 5. This results in a substantial cost saving and design flexibility, since IGBT 5 can be used regardless of the rating of the pad. In some embodiments, the breakdown voltage is altered by changing the number of diodes that make up collector clamp 35, without having to change the rating of the diodes.

Referring to FIG. 3, another circuit for electrostatic discharge protection is illustrated. In FIG. 3, another IGBT 60 is added to ESD protection circuit 2. An emitter 65 of IGBT 60 is coupled to emitter 20 of IGBT 5. The gate 70 of IGBT 60 is coupled to its emitter 65 through emitter clamp 41 and resistor 46. Collector 80 of IGBT 60 is coupled to pad 81. Another collector clamp 75 couples gate 70 of IGBT 60 to pad 81. IGBT 5 is coupled essentially the same way as illustrated in FIG. 1.

The circuit in FIG. 3 is especially advantageous in handling bi-directional ESD events, where a voltage at pad 81 is greater than a potential at pad 15 as well the reverse. This is because IGBT 5 responds to positive ESD events, while IGBT 60 responds to negative ESD events. Further, both collector clamps 35 and 75 can be optimized either together or separately to allow flexibility in the ESD rating of pad 15.

It should be noted that the ESD protection circuits of FIGS. 1 and 3 can be integrated circuits for ease of use and manufacture onto pad 15.

The circuits described in FIGS. 1 and 3 can be utilized regardless of the desired voltage rating of pad 15 without changing IGBT 5 or IGBT 60. IGBT 5 can, for example, withstand 5,000 volts during an ESD event, or any other amount. However, the circuit can operate for a pad 15 rated to almost any value, simply by changing the trigger voltage of collector clamp 35 or collector clamp 75 to the desired rating. In the case where either collector clamp 35 or collector clamp 75 comprises diodes, the trigger voltage can be changed by adding or removing diodes. This greatly increases the utility and cost effectiveness of the ESD protection circuits 2 illustrated in FIGS. 1 and 3 over conventional ESD protection designs.

Referring to FIG. 4, a cross-sectional side view of a lateral insulated gate bipolar transistor 5 for electrostatic discharge protection circuit 2 is illustrated. In FIG. 4, IGBT 5 comprises a substrate 100, which may be p-type. An epitaxial region 105, which may be n-type, is diffused into substrate 100. An isolation region 110, which may also be an up-diffused p-type region, is also formed in substrate 100, along with a p-well 115. A first emitter region 120, which may be p+-type, and a second emitter region 125, which may be n+-type, are formed within p-well 115. A collector region 130, which also may be p+-type, is formed in a n-well 135 that is formed in epitaxial region 105. Portions of n-well 135 and p-well 115 are separated by epitaxial region 105, while other portions form a junction.

A gate electrode 140, which in one embodiment is comprised of a polycrystalline silicon material, is located above an extended portion of p-well 115, a portion of second emitter region 125, and a portion of n-well 135. A field oxide 145 is interposed between gate electrode 140 and another portion of n-well 135. An emitter electrode 150 is in common contact with both first emitter region 120 and second emitter region 125. A collector electrode 155 is in contact with collector region 130. An insulation film 165, formed of a thermally oxidized film, a boron phosphorous silicate glass (BPSG) or other insulation, is disposed over IGBT 5 for surface protection and for surface stabilization.

Operation of the IGBT 5 of FIG. 4 will now be described. Once a voltage, higher than the threshold voltage and positive with respect to a potential of emitter electrode 150, is applied to gate electrode 140, an inversion layer 170 on the surface of p-well 115 is created between second emitter region 125 and n-well 135. Electrons then flow from second emitter region 125 through p-well 115 into n-well 135 through inversion layer 170. The electron flow into n-well 135 functions as a base current of a pnp transistor 175, which is formed by collector region 130 (transistor emitter), n-well 135 (transistor base), and p-well 115 (transistor collector).

Once collector region 130 reaches a voltage greater than 0.7 volts above that of n-well 135, collector region 130 begins to inject holes into p-well 115 (transistor collector), thereby causing conduction by PNP transistor 175. The difference of 0.7 volts, between collector region 130 and n-well 135, can be altered by changing the doping of the collector region 130 and the n-well 135, which effects the potential at which pnp transistor 175 conducts.

Parasitic thyristor 180 latches up when the holes collected in p-well 115 flow under second emitter region 125 and forward bias first emitter region 120. Parasitic thyristor 180 then will conduct all of the current flowing through the IGBT 5. Parasitic thyristor 180 consists of second emitter region 125 (thyristor cathode), p-well 115 (npn transistor base), n-well 135 (pnp transistor base), and collector region 130 (thyristor anode). Further, parasitic thyristor 180 will not cease conduction until all of the charge at collector electrode 155 is dissipated. Latching of parasitic thyristor 180 varies based upon the pinched resistance of p-well 115. The pinched resistance of p-well 115 is a function of the dimensions of second emitter region 125 and p-well 115, as discussed with respect to FIG. 9.

Triggering the parasitic thyristor 180 in IGBT 5 runs counter to the accepted and desired use of IGBTs. This is because, as described above, parasitic thyristor 180 will not cease conduction until the charge at collector electrode 155 is dissipated. The result is that, once the parasitic thyristor 180 is latched up, the IGBT 5 cannot be controlled by its bias circuitry and cannot operate in its linear amplification or switching region.

It should be noted that isolation region 110 is used to reduce the surface electric fields (RESURF) between p-well 115 and n-well 135. Further, by varying the depth of isolation region 110 the collector to emitter breakdown voltage, which is the forward blocking voltage of IGBT 5, can be varied.

Referring to FIG. 5, a graph of the current-voltage characteristics of a collector of the lateral insulated gate bipolar transistor illustrated in FIG. 4 is illustrated. In FIG. 5, as collector to emitter voltage 200 increases, it will snap-back 210 when parasitic thyristor 180 latches up. Also, as the voltage at gate 30 is increased the snap-back voltage of the parasitic thyristor 180 decreases, as shown by gate voltage levels 215, 220, 225, and 230.

Additionally, FIG. 5 illustrates the advantage of the use of an IGBT for ESD protection by showing operation of parasitic thyristor 180. Specifically, parasitic thyristor 180 latches up at a voltage which is a sum of the clamp trigger voltage 235 and the gate voltage of the IGBT. This can be altered by changing the pinched resistance of p-well 115. Upon latching up, the parasitic thyristor 180 begins conducting, thereby reducing the charge at pad 15 (FIG. 1) until all of the charge at pad 15 is dissipated. The operation of parasitic thyristor 180 is shown by curve 240.

The collector to emitter breakdown voltage 245 is the voltage at which IGBT 5 is not able function in a forward blocking state. In ESD protection circuit 2, the breakdown voltage of collector clamp 35 must be set to a level below the collector to emitter breakdown voltage 245 minus the gate voltage of IGBT 5 required to trigger parasitic thyristor 280.

Referring to FIG. 6, a cross-sectional view of another embodiment of a lateral insulated gate bipolar transistor S for electrostatic discharge protection circuit 2 is illustrated. In FIG. 6, a second collector region 300, which may be n+-type, is added, so as to form a junction with the collector region 130. The second collector region 300 acts as a short between collector electrode 155 and n-well 135 during conduction by IGBT 5.

Further, another p-type well region 305 is used to improve the injection of holes from the collector region 130 into the second portion 310 of the n-well 135, which is separated from the first portion 315 of the n-well 135. The first portion 315 and second portion 310 are connected by a buried region 317, which is n-type. The collector region 130 is p+-type.

Referring to FIG. 7, a cross-sectional view of a further embodiment of a lateral insulated gate bipolar transistor for electrostatic discharge protection is illustrated. In FIG. 7, a metal contact 320 is then added to collector electrode 155. The metal contact 320, which is a Schottky contact, acts as a short between collector electrode 155 and n-well 135 during conduction by IGBT 5. The short between collector electrode 155 and n-well 135 improves bi-directional ESD event dissipation and allows for conduction by IGBT 5 at a lower voltage. Further, metal contact 320 improves the homogenous turn on of parasitic thyristor 180.

Alternatively, collector electrode 155 can itself be completely or partially formed of a metallic material to form either an ohmic or a Schottky contact to collector region 135.

An advantage of the lateral IGBTs in FIGS. 6 and 7 over that of FIG. 4 is the reaction of the IGBT to negative ESD events, where the charge at the pad 15 (FIG. 1) is negative with respect to potential 25. Substrate 100 and n-well 135 form a diode between substrate 100 and collector electrode 155 due to the short between n-well 135 and collector electrode 155. The diode conducts current induced by negative ESD events from pad 15 to substrate 100, and allows IGBT 5 to dissipate voltages induced by negative ESD events. The use of the structures of FIGS. 6 and 7 improves the response to negative ESD events versus that of FIG. 4.

Referring to FIG. 8, a graph of the current-voltage characteristics of a collector of a lateral insulated gate bipolar transistor 5 of FIGS. 6 and 7 is illustrated. As the collector to emitter voltage 400 increases, it will snap-back at 410 as parasitic thyristor 180 latches-up, as described with respect to FIG. 5. Also, as the voltage on gate 30 is increased, the latch-up voltage of the parasitic thyristor 180 decreases, as shown by gate voltage levels 415, 420 and 430 as described with respect to FIG. 5.

A feature of the IGBT structures of FIGS. 6 and 7 is collector conduction prior to the turn on of pnp transistor 175, as shown by early current flows 435.

Although exemplary doping characteristics are discussed with respect to FIGS. 4, 6 and 7, other doping including those that result in complimentary structures to those disclosed are possible and can be used in the circuits of FIGS. 1 and 3. For example, doping concentrations of $3 \times 10^{16}$ for p-well 115 and $7 \times 10^{16}$ for n-well 135 can be used.

Further, additional variations may be made to the IGBT structures discussed with respect to FIGS. 4, 6, and 7. For example, a p-well or p-body region, or complementary doping in a complementary IGBT, that is self-alligned with gate electrode 140 may be included. Also, for low voltage applications, field oxide 145 can be replaced with thin oxide.

Referring to FIG. 9, an enlarged cross-sectional view of a region in a well at the emitter of a lateral insulated gate bipolar transistor from any of FIGS. 4, 6, and 7 is illustrated. In FIG. 9, a region 500 and a well region 505 are illustrated. Region 500 has a width 510 and length 515, while well region 505 has a depth 520. The pinch resistance of well region 505 is then equal to:

$$R_{well} = \frac{\rho_{well} L}{WZ} \quad \text{Equation 1}$$

where $\rho_{well}$ is the resistivity of the material that comprises well region 505, L is width 510, W is depth 520, and Z is length 515. By increasing width 510 or depth 520, the resistance of the well region 505 decreases, thereby increasing the latching current of the parasitic thyristor 180. Also, if the length of region 500 is decreased, then the resistance of well region 505 will also increase the latching current parasitic thyristor 180.

Referring to FIG. 10, a cross-sectional view of a lateral insulated gate bipolar transistor with leakage current reduction is illustrated. The IGBTs shown in FIGS. 4, 6, and 7 each have a small leakage current on the surface of the pnp transistor 175. This leakage current, which is inherent to the structure of an IGBT, can cause erroneous latching of the parasitic thyristor 180 due to the leakage current that occurs prior to triggering of collector clamp 35. Inserting a punch through reduction region 550 that forms a butting junction with collector region 130 on the side of field oxide 145 can substantially reduce or eliminate the leakage current. This punch through reduction region 550 should be of a complementary doping to collector region 130, which for example would be an n-type punch through reduction region for a $p^+$-type collector region. The punch through reduction region 550 can be relatively small in width; in one embodiment, the width is no more than two (2) microns. The use of a punch through reduction region 505 reduces inaccurate and premature latching of the parasitic thyristor 180.

Alternatively, to reduce the leakage current, a buffer region can be added to the n-well 135. The buffer region can be formed by heavily doping the portion of the n-well 135 abutting the collector region 130.

Referring to FIG. 11, of a pad 15 with an electrostatic discharge protection circuit fabricated upon it is illustrated. Pad 15 has a trace 700 that forms resistor 45 and diffusions 705 that form collector clamp 35, which is made up of a number of diodes. Diffusions 705 have a number of contacts 710 to pad 15.

Gate 140, which has rounded corners as depicted, overlies n-well 135, p-well 115, and second emitter region 125. Each of n-well 135, p-well 115, and second emitter region 125 have a similar shape to gate 140. A number of contacts 720 provide bonding to pad 15.

Collector region 130 is diffused along a periphery of pad 115 and also has a number or contacts 720.

By fabricating IGBT 5 on a pad, the ruggedness of IGBT 5 is increased due to the charge distribution on the device. Further, the response time of IGBT 5 improves by fabricating it on pad 15, thereby reducing the potential for damage to integrated circuits bonded to pad 15. In another embodiment, IGBT 5 is fabricated on at least two sides of one of the surfaces of pad 15.

While FIG. 11 depicts IGBT 5 in a substantially oval configuration, other configurations of IGBT can be used. For example, race-track, or configurations having multiple fingers can be used. Further, IGBT 5 can be fabricated on two or three sides of a surface of pad 15.

Figure 12:
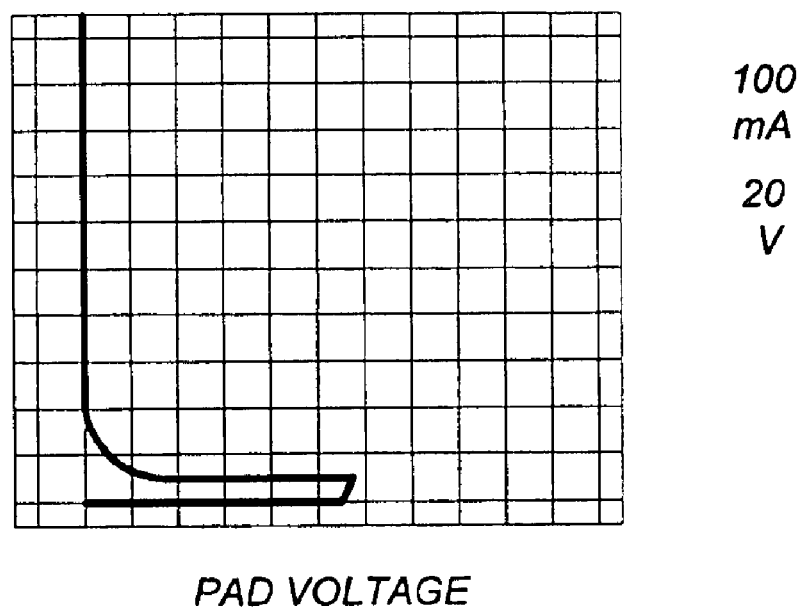
FIG. 12 is a graph of the direct current characteristics in response to an ESD event of the electrostatic discharge protection circuit fabricated on a pad as illustrated in FIG. 11, when a parasitic thyristor latches.

Referring to FIG. 12 is a graph of the direct current characteristics in response to an ESD event of the electrostatic discharge protection circuit 2 fabricated on pad 15 (FIG. 11), when the parasitic thyristor 180 latches. As can be seen, the amount of time required to dissipate the large voltage at pad 15 is minimal. Specifically, the triggering of parasitic thyristor 180 almost instantaneously reduces the voltage to a low holding voltage. Further, parasitic thyristor 180 snaps-back to the low holding voltage without damage to electrostatic discharge protection circuit 2 and IGBT 5.

It should be noted that while IGBT 5 is illustrated as a lateral IGBT in FIGS. 4, 6, and 7, a vertical IGBT can also be utilized based upon the principles and utilizing the same region constituents as described herein. Further, it would be advantageous to use a vertical IGBT in an integrated ESD protection circuit.

Embodiments of ESD protection circuits and transistors capable of being used with the ESD circuits described herein are also depicted and described in a copending U.S. patent application entitled "Thick Gate Oxide Transistor And Electrostatic Discharge Protection Utilizing Thick Gate Oxide Transistors," Ser. No. 10/336,202, which is assigned to the Assignee of the current application, and was filed on the same date (i.e., Jan. 3, 2003) as the present application.

The detailed description provided above is merely illustrative, and is not intended to be limiting. While the embodiments, applications and advantages of the present inventions have been depicted and described, there are many more embodiments, applications and advantages possible without deviating from the spirit of the inventive concepts described and depicted herein. The invention should only be restricted in accordance with the spirit of the claims appended hereto and is not restricted by the embodiments, specification or drawings.

What is claimed is:

1. A circuit for protection from electrostatic discharge events, comprising:
   an insulated gate bipolar transistor comprising a gate, an emitter and a collector, wherein the collector is coupled with a pad;
   a collector clamp coupled with the pad and the gate;
   an emitter clamp coupled with the emitter and the gate; and
   a resistance coupled with the emitter and the gate and with the emitter clamp,
   wherein the insulated gate bipolar transistor comprises a vertical insulated gate bipolar transistor.

2. A circuit for protection from electrostatic discharge events, comprising:
   an insulated gate bipolar transistor comprising a gate, an emitter and a collector, wherein the collector is coupled with a pad;
   a collector clamp coupled with the pad and the gate;
   an emitter clamp coupled with the emitter and the gate; and
   a resistance coupled with the emitter and the gate and with the emitter clamp,
   wherein the insulated gate bipolar transistor comprises a lateral insulated gate bipolar transistor.

3. The circuit of claim 2 wherein the lateral insulated gate bipolar transistor comprises an isolation region located between a substrate and a well of the lateral insulated gate bipolar transistor.

4. The circuit of claim 2 further comprising a punch through reduction region located in a semiconductor substrate of the insulated gate bipolar transistor substantially between a collector region of the lateral insulated gate bipolar transistor and a gate electrode of the lateral insulated gate bipolar transistor disposed over the semiconductor substrate.

5. The circuit of claim 4 wherein the punch through reduction region has a width approximately equal to two microns.

6. A circuit for protection from electrostatic discharge events, comprising:
   an insulated gate bipolar transistor comprising a gate, an emitter and a collector, wherein the collector is coupled with a pad;
   a collector clamp coupled with the pad and the gate;
   an emitter clamp coupled with the emitter and the gate; and
   a resistance coupled with the emitter and the gate and with the emitter clamp,
   wherein the collector clamp comprises at least one diode.

7. A circuit for protection from electrostatic discharge events, comprising:
   a first insulated gate bipolar transistor comprising a first gate, a first emitter and a first collector, wherein the first collector is coupled with a pad;
   a collector clamp coupled with the pad and the first gate;
   an emitter clamp coupled with the first emitter and the first gate;
   a resistance coupled with the first emitter and the first gate and with the emitter clamp;
   a second insulated gate bipolar transistor comprising a second gate, a second emitter, and a second collector, the second emitter coupled with the first emitter of the first insulated gate bipolar transistor and the second collector coupled with a second pad; and
   a second collector clamp coupled with the second pad and the second gate.

8. A circuit for protection from electrostatic discharge events, comprising:
   an insulated gate bipolar transistor comprising a gate, an emitter and a collector, wherein the collector is coupled with a pad;
   a collector clamp coupled with the pad and the gate;
   an emitter clamp coupled with the emitter and the gate; and
   a resistance coupled with the emitter and the gate and with the emitter clamp,
   wherein the circuit comprises an integrated circuit.

9. A structure for electrostatic discharge protection of pads housing integrated circuits, comprising:
   a pad comprising at least two surfaces;
   an insulated gate bipolar transistor comprising a gate, a emitter and a collector, the insulated gate bipolar transistor being fabricated on one of the at least two surfaces of the pad;
   a collector clamp coupled with one of the at least two surfaces of the pad and the gate of the insulated gate bipolar transistor; and
   a resistor coupled with one of the at least two surfaces and the gate of the insulated gate bipolar transistor,
   wherein the insulated gate bipolar transistor has a substantially oval shape.

10. A circuit for protection from electrostatic discharge events, comprising:
    a first insulated gate bipolar transistor comprising a first gate, a first emitter and a first collector, wherein the first collector is coupled with a pad;
    a collector clamp coupled with the pad and the first gate;
    an emitter clamp coupled with the first emitter and the first gate;
    a resistance coupled with the first emitter and the first gate and with the emitter clamp;
    a second pad;
    a second insulated gate bipolar transistor, wherein an emitter of the second insulated gate bipolar transistor is coupled with the first emitter of the first insulated gate bipolar transistor and a collector of the second insulated gate bipolar transistor is coupled with the second pad.

11. The circuit of claim 10, wherein the second insulated gate bipolar transistor includes a second gate, and further comprising:
    a second resistance coupled with the second emitter and the second gate; and a second collector clamp coupled with the second pad and the second gate.

12. The circuit of claim 11, further comprising a second emitter clamp coupled with the second emitter and the second gate.

13. A circuit for protection from electrostatic discharge events, comprising:
  first and second pads of an integrated circuit;
  first and second insulated gate bipolar transistors each comprising a gate, an emitter, and a collector; and
  first and second collector clamps, the first collector clamp coupled with the first pad and the first gate, and the second collector clamp coupled with the second pad and the second gate,
  wherein the collector of the first insulated gate bipolar transistor is coupled to the first pad, the emitter of the first insulated gate bipolar transistor is coupled to the emitter of the second insulated gate bipolar transistor, and the collector of the second insulated gate bipolar transistor is coupled to the second pad.

14. The circuit of claim 13, further comprising first and second resistances, the first resistance coupled with the first gate and the first emitter and the second resistance coupled with the second gate and the second emitter.

15. The circuit of claim 14, further comprising first and second emitter clamps each comprising at least one diode, the first emitter clamp being coupled with the first gate and the first emitter, and the second emitter clamp being coupled with the second gate and the second emitter.

16. A circuit for protection from electrostatic discharge events, comprising:
  a pad of an integrated circuit;
  an insulated gate bipolar transistor having a gate, a collector, and an emitter, the insulated gate bipolar transistor being formed on the pad;
  a collector clamp coupled with the pad and the gate, the collector clamp comprising a plurality of diodes; and
  a resistance coupled with the gate and the emitter.

* * * * *